(12) United States Patent
Hung et al.

(10) Patent No.: US 8,329,480 B2
(45) Date of Patent: Dec. 11, 2012

(54) TEST PATTERN FOR DETECTING PIPING IN A MEMORY ARRAY

(75) Inventors: Che-Lun Hung, Hsinchu (TW); Hsiang-Chou Liao, Taipei (TW); Tuung Luoh, Taipei (TW); Ling-Wu Yang, Hsinchu (TW)

(73) Assignee: Macronix International Co., Ltd., Science Park, Hsin-Chu (TW)

( * ) Notice: Subject to any disclaimer, the term of this patent is extended or adjusted under 35 U.S.C. 154(b) by 274 days.

(21) Appl. No.: 12/892,479

(22) Filed: Sep. 28, 2010

(65) Prior Publication Data
US 2012/0074401 A1 Mar. 29, 2012

(51) Int. Cl.
G01R 31/26 (2006.01)

(52) U.S. Cl. ............... 438/18; 438/14; 438/16; 438/17; 257/42; 257/48

(58) Field of Classification Search .................. None
See application file for complete search history.

(56) References Cited

U.S. PATENT DOCUMENTS
7,679,083 B2 * 3/2010 Sun et al. ............... 257/48

* cited by examiner

Primary Examiner — Kyoung Lee
(74) Attorney, Agent, or Firm — Alston & Bird LLP (57) ABSTRACT

A method of detecting manufacturing defects at a memory array may include disposing an active area of a first width in communication with a first conductive member of the memory array to define a grounded conductive member, disposing an isolation structure of a second width in communication with a second conductive member of the memory array to define a floating conductive member, and providing an alternating arrangement of floating and grounded conductive members including arranging a plurality of the grounded and floating conductive members adjacent to each other to define a sequence of alternating floating and grounded conductive members. A corresponding test device is also provided.

17 Claims, 9 Drawing Sheets

TEST PATTERN FOR DETECTING PIPING IN A MEMORY ARRAY

TECHNOLOGICAL FIELD

Embodiments of the present invention relate generally to semiconductor device manufacturing and, more particularly, relate to a process for screening manufacturing defects such as piping in semiconductor devices such as memory arrays.

BACKGROUND

Since the advent of computers, there has been a steady drive toward producing smaller and more capable electronic devices, such as computing devices, communication devices and memory devices. In order to reduce the size of such devices, while maintaining or improving their respective capabilities, the size of components within the devices must be reduced. Several of the components within electronic devices are made from semiconductor materials, which in some cases are provided via a structure called a semiconductor wafer. Semiconductor wafers may be used to produce integrated circuits (ICs) having the performance and size characteristics desirable for a particular component.

Since modern integrated circuits can be manufactured to such small scales, any defects on the ICs may have a relatively large impact on performance. If a defect is of a nature or size that is sufficient to damage semiconductor circuits or degrade the operating characteristics of such circuits, the corresponding semiconductor device's performance may be deteriorated. Defects, which may be produced during any of a plurality of manufacturing process steps, may cause shorts, opens or other anomalies that prevent normal operation of the semiconductor device. The impact caused by a particular defect is often directly related to the corresponding nature (e.g., size and/or location) of the defect. These defects must typically be recognized so that the defective components may be removed before they are provided to consumers.

Numerous testing processes have been developed to attempt to identify defects at various stages of the production process. Electron beam (e-beam) imaging is one example of a testing process that may be used to look for defects in certain devices such as memory arrays. An e-beam inspection or scan tool that is sensitive to electrical properties may provide resolution sufficient to detect defects that may not be perceivable by optical methods. However, for a standard shallow trench isolation (STI) mask, the active area (e.g., N+/P-well areas) may be structured such that piping between contact plugs (COs) (i.e., piping between contact plug to contact plug or CO to CO) may be hard to detect. The difficulty in detecting such piping may be at least in part due to the fact that there is only one surrounding of flash CO in the array active area, so all of the COs are typically grounded to make it difficult to detect piping. The piping would manifest itself by the connected COs having the same potential. However, if all COs are grounded, it may be hard to detect a difference between normal and piping COs based on the gray level difference therebetween.

Accordingly, it may be desirable to provide an improved testing pattern that may address some of the shortcomings described above.

BRIEF SUMMARY OF EXEMPLARY EMBODIMENTS

Embodiments of the present invention are therefore provided that may enable the provision of a test pattern for screening piping defects in semiconductor devices such as memory arrays. In some example embodiments, a test pattern may be provided that uses an enlarged STI pitch (e.g., doubled) in order to create a different array drain CO environment. With the enlarged STI pitch, the drain COs may be structured such that about half of the drain COS stand on ground while the other half stand on isolation oxide. Thus, grounded and floating COs may appear alternately so that electrical differences may be appreciated between adjacent COs, thereby enabling an e-beam inspection tool to detect piping issues.

In an example embodiment, a method of screening piping defects at a memory array is provided. The method may include disposing an active area of a first width in communication with a first conductive member of the memory array to define a grounded conductive member, disposing an isolation structure of a second width in communication with a second conductive member of the memory array to define a floating conductive member, and providing an alternating arrangement of floating and grounded conductive members by arranging a plurality of the grounded and floating conductive members adjacent to each other to define a sequence of alternating floating and grounded conductive members.

In another example embodiment, a test device for screening piping defects at a memory array is provided. The test device may include a wafer and an electron beam inspection tool. The wafer may include the memory array and the electron beam inspection tool may be configured to inspect the wafer. The wafer may be structured by disposing an active area of a first width in communication with a first conductive member of the memory array to define a grounded conductive member, disposing an isolation structure of a second width in communication with a second conductive member of the memory array to define a floating conductive member, and providing an alternating arrangement of floating and grounded conductive members by arranging a plurality of the grounded and floating conductive members adjacent to each other to define a sequence of alternating floating and grounded conductive members.

It is to be understood that the foregoing general description and the following detailed description are exemplary, and are not intended to limit the scope of the invention.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements.

Figure 1:
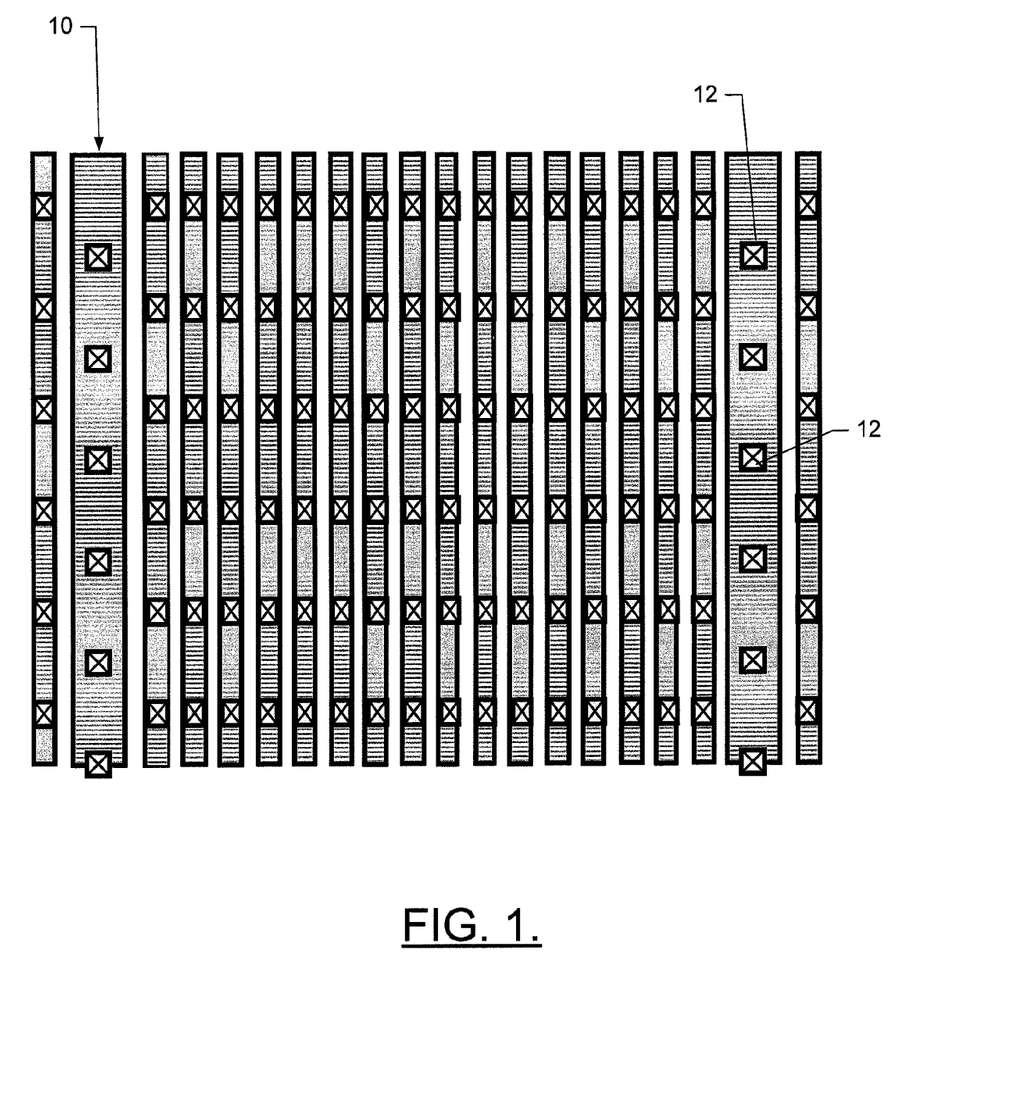
FIG. 1 illustrates a generic arrangement of a normal diffusion mask showing typical contact member positions.
Figure 2:
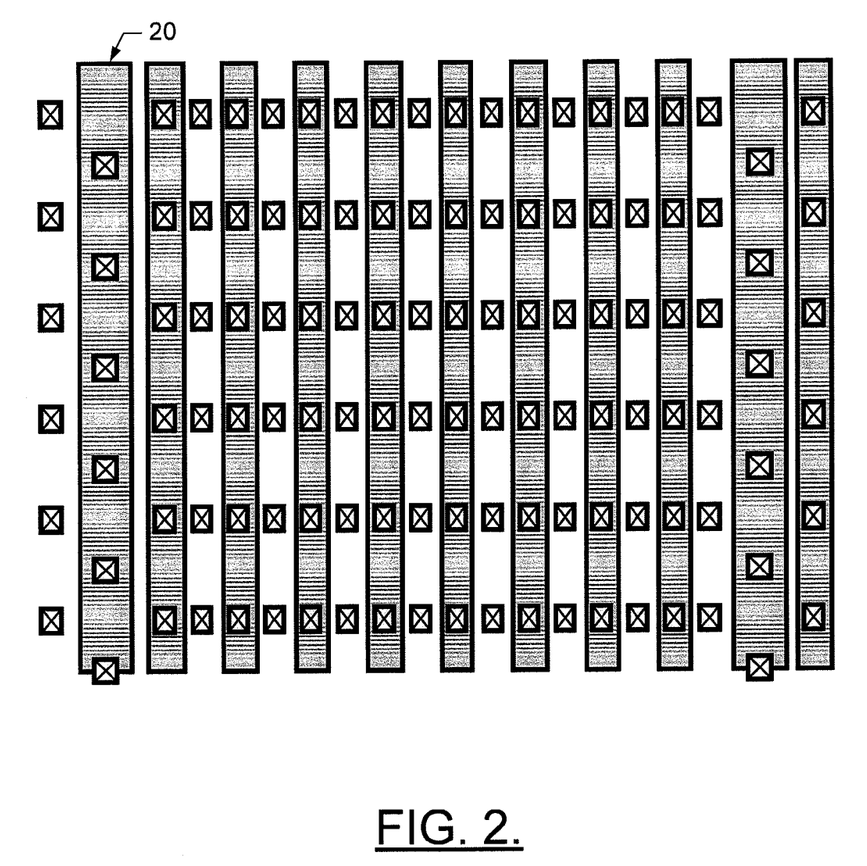
FIG. 2 illustrates a diffusion mask employed according to an example embodiment.

Some embodiments of the present invention may enable the determination of piping defects in semiconductor devices such as memory arrays. FIG. 1 illustrates a generic arrangement of a normal diffusion mask 10 showing typical contact member or CO positions 12 thereon. Meanwhile, FIG. 2 illustrates a diffusion mask 20 employed according to an example embodiment. As shown in FIG. 2, the diffusion mask 20 utilizes double the pitch of drain CO area relative to the pitch shown in FIG. 1.

Figure 3:
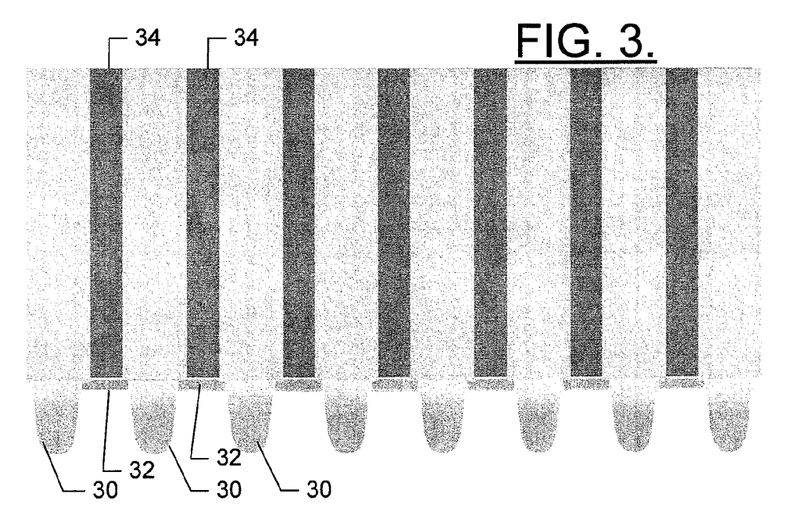
FIG. 3 illustrates a cross section of the normal diffusion mask of FIG. 1.

FIG. 3 illustrates a cross section of the normal diffusion mask 10 of FIG. 1. The array of FIG. 3 has a standard layout and employs STI trench oxide isolations 30 that divide the bottom of the structure into a plurality of active areas 32 (e.g., N+/P−well). In some cases, conductive members such as bit lines, cylindrical conductors and/or other storage nodes may be connected to the active areas 32 via plugs or conductive members. A W-plug) 34 is an example of a conductive member or plug that may be provided after W1 CMP (chemical mechanical planarization).

Figure 4:
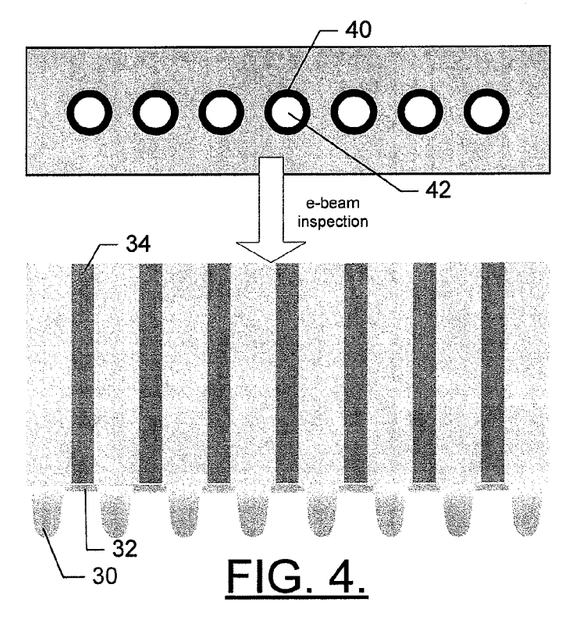
FIG. 4 illustrates example e-beam scan results for a memory array of the example of FIG. 3.

During a typical e-beam inspection of the array of FIGS. 1 and 3, the electrical condition of each of the conductive members may be expected to be similar (e.g., being grounded). Thus, for example, if a high LE landing energy e-beam inspection tool is used (e.g., with a LE range from about 2000 to 2500 eV and a current of about 5 to 150 mA), to inspect the normal diffusion mask 10, results expected may be as is shown in FIG. 4. In this regard, a dark ring 40 and a bright W-plug 42 would typically be expected for each normal STI pitch flash array CO. The W-plug shows up as a bright portion due to bulk material and the dark ring appears due to the local electrical field.

Figure 5:
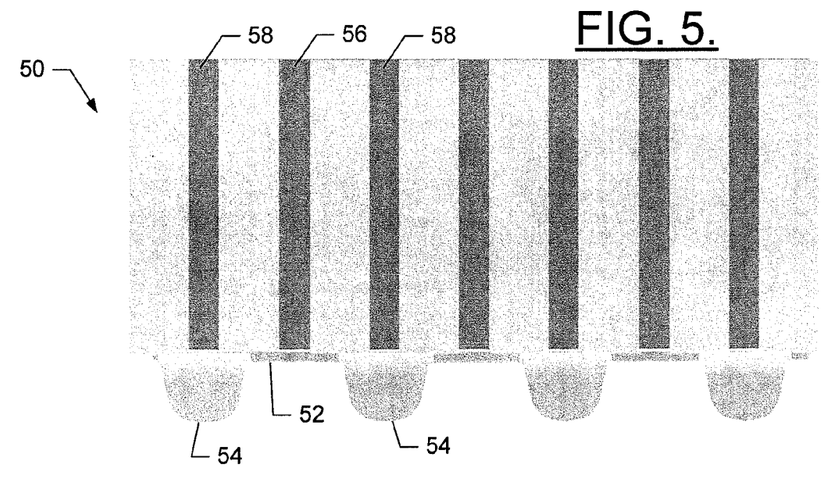
FIG. 5 illustrates a cross section of a diffusion mask according to an example embodiment.

FIG. 5 illustrates a cross section of a diffusion mask 50 according to an example embodiment. The cross section of the diffusion mask 50 includes double pitch active areas 52 and double pitch STI trench oxide isolations 54. By providing double pitch, alternating COs (e.g., W-plugs or conductive members) have different electrical conditions associated therewith. In this regard, COs that terminate at one of the double pitch active areas 52 may be grounded COs 56, while COs that terminate at one of the double pitch STI trench oxide isolations 54 may be floating COs 58.

Figure 6:
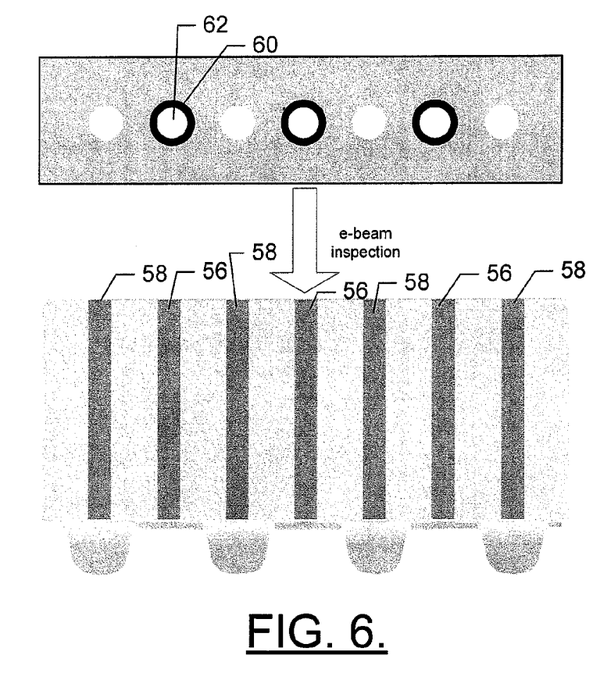
FIG. 6 illustrates example e-beam scan results for a memory array of the example of FIG. 5.

If the array of FIGS. 2 and 5 is inspected using the same e-beam inspection tool described above for use in inspecting the array of FIGS. 1 and 3, the dark ring 60 and bright portion of the W-plug 62 may only be visible for every other CO due to the fact that only every other CO terminates in an active area, while others terminate in an STI trench isolation as shown in FIG. 6. In other words, the grounded COs 56 may appear similar to the COs shown in FIG. 4. However, the floating COs 58 may appear different as shown in FIG. 6.

Figure 7:
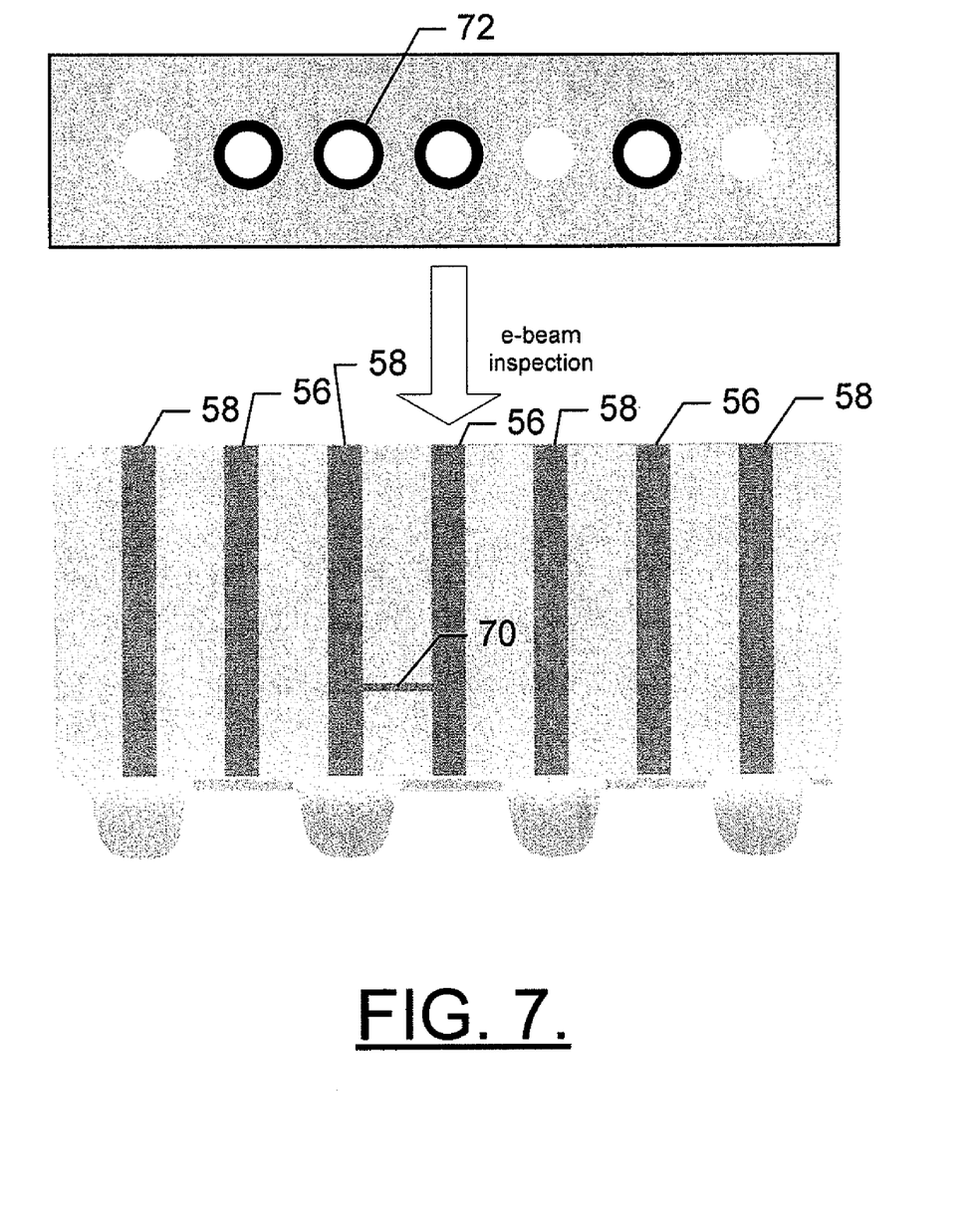
FIG. 7 illustrates example e-beam scan results for a memory array having a piping defect according to an example embodiment.

In a situation in which there is a piping defect that connects or bridges between two (or more) adjacent COs in the array of FIGS. 1 and 3, the scan results may be similar to those shown in FIG. 4 since each CO shows the same (or nearly the same) results already in FIG. 4. However, the scan results for the arrangement of FIGS. 2 and 5 may tend to be modified and thus a piping defect may be detectable due to differences from the normal scan shown in FIG. 6. In this regard, FIG. 7 shows a piping defect 70 extending between adjacent COs to render the COs shorted. The piping defect 70 tends to provide similar electrical conditions in the connected or bridged COs. Thus, rather than having alternating COs displaying different electrical conditions, an abnormal dark ring 72 may be perceived. The abnormal dark ring 72 may be perceived since the corresponding CO is no longer floating, but is instead grounded by virtue of the piping defect 70.

Figure 8:
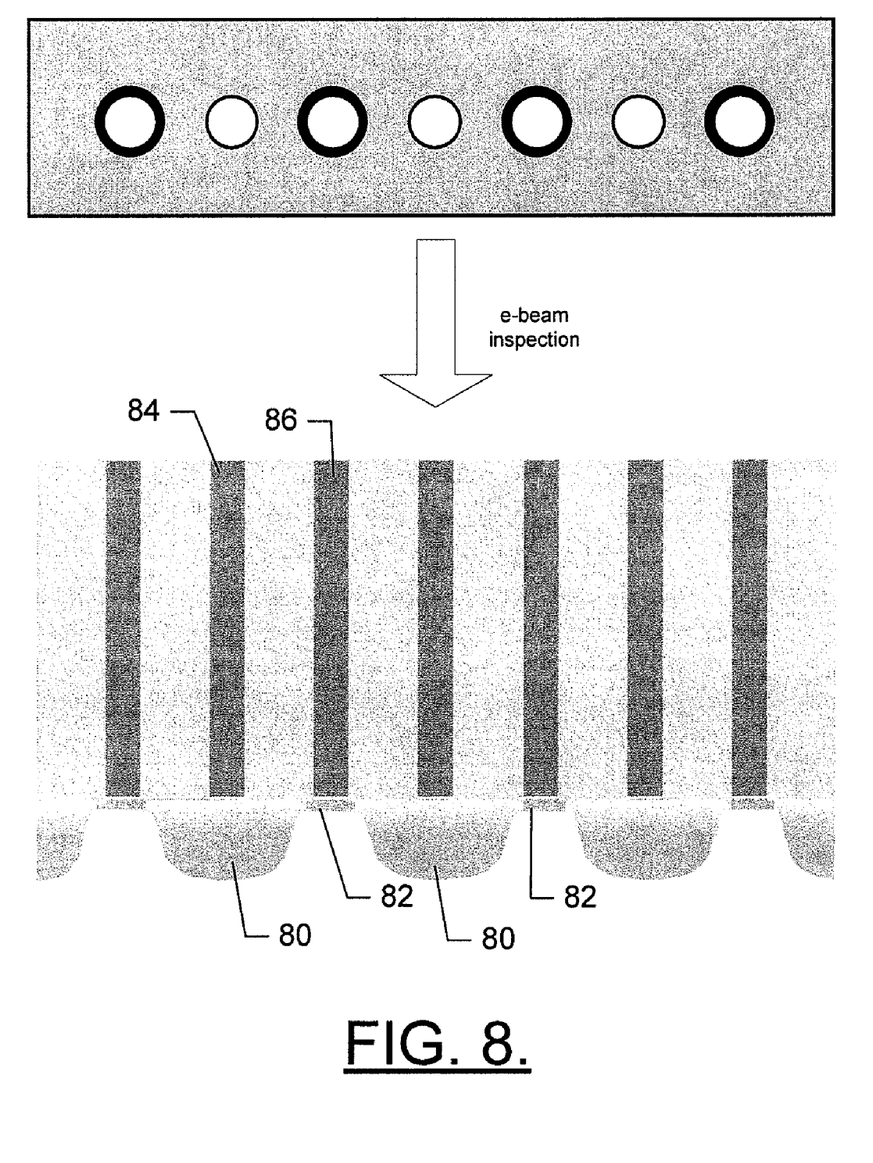
FIG. 8 illustrates an alternative to the structure of FIG. 5 in which the widths of active areas and isolation areas are different according to an example embodiment.

Although the pitch doubling for both the active area and the STI trench isolations may provide alternating floating and grounded COs, which then enhances the ability of the e-beam inspection tool to detect piping defects as described above, pitch doubling is not the only way to achieve this result. Indeed any adjustment to the structure of the active area and the STI trench isolations that results in alternating floating and grounded COs may be used to achieve the desired result. FIG. 8 illustrates an example in which, rather than pitch doubling for both the active area and the STI trench isolations, only the area width of the STI trench isolations 80 is increased, while the width of the active areas 82 is decreased. In this case again, every other CO is in communication with one of the reduced-width active areas 82. The COs between each alternating CO that is in communication with the reduced-width active areas 82 are in communication with the increased-width STI trench isolations. Accordingly, an alternating pattern of floating COs 84 and grounded COs 86 is again provided to enhance the effectiveness of the e-beam inspection tool. As shown in FIG. 8, the expected pattern of encountering dark rings 84 and bright W-plugs 86 for alternating grounded COs is again provided so that if one of the floating COs 88 is connected to an adjacent grounded CO by a piping defect, the piping defect may be detected by the fact that the expected pattern of alternating grounded and floating COs will be interrupted by an instance of adjacent grounded COs appearing in the e-beam inspection tool scan results (e.g., similar to the results shown in FIG. 7). Similarly, it may be possible to increase the width of the active areas, while decreasing the width of the STI trench isolations as long an alternating pattern of floating and grounded COs is provided.

Figure 9:
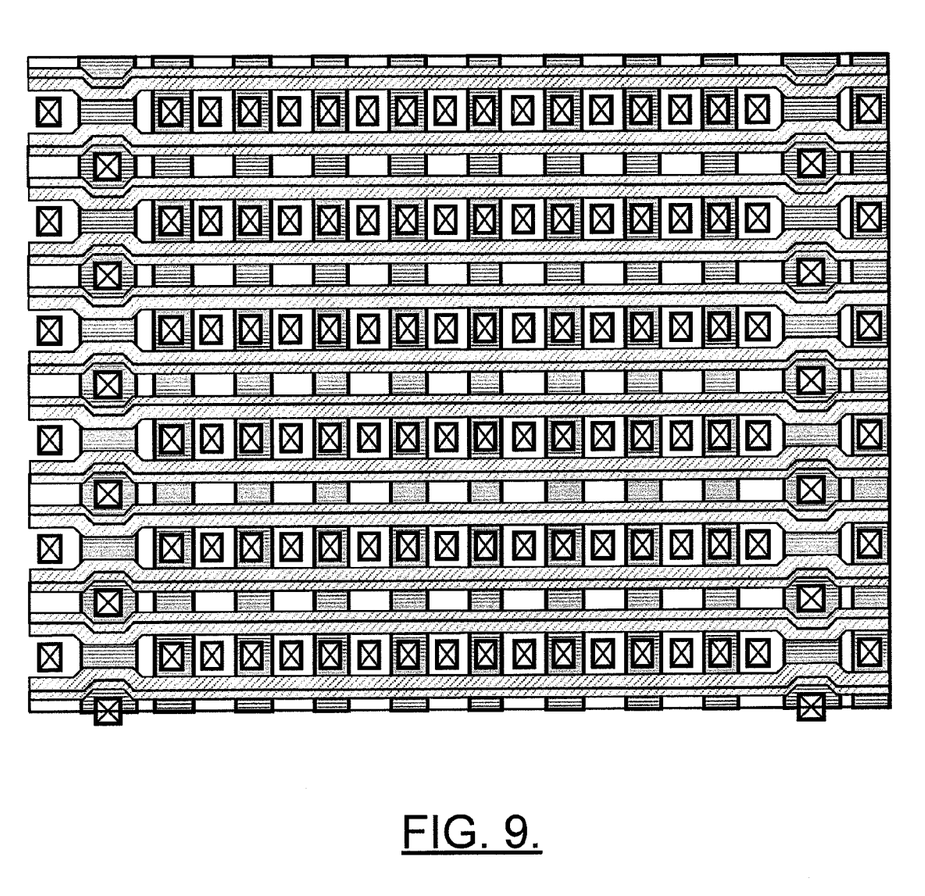
FIG. 9 shows a diagram illustrating a structure of a memory array according to an example embodiment.

FIG. 9 shows a diagram illustrating a structure of a memory array according to an example embodiment. In FIG. 9, each of the diffusion or active areas that have a corresponding normal grounding CO are illustrated with horizontal cross-hatching. Areas with Poly2 (WL—word lines) are shown with diagonal cross-hatching. In some cases, piping may be relatively easy to detect in these areas when inter-layer dielectric (ILD) deposition is performed therein. Areas corresponding to a self-aligning source (SAS) are shown without any fill, and contact areas (CONT) are shown with an "X" in the corresponding areas and include alternating grounding and floating drain COs as indicated by their alternating correspondence with grounded diffusion or active areas. The contact areas (CONT) of FIG. 9 may have a relatively higher likelihood of having high ILD fill-in issues that may lead to the occurrence of piping defects. As such, FIG. 9 shows an example memory structure for which example embodiments may be employed to detect any such defects that may occur.

Figure 10:
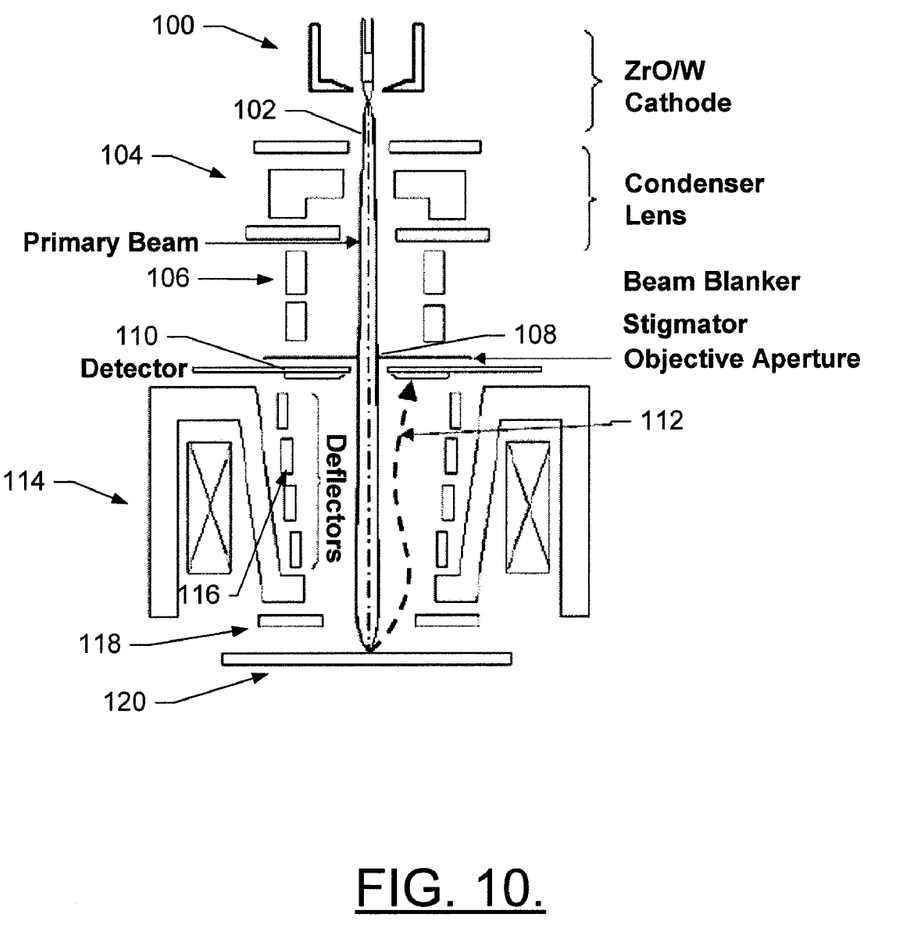
FIG. 10 is a diagram of an e-beam inspection tool according to an example embodiment.

FIG. 10 illustrates an example e-beam inspection tool structure according to an example embodiment, although it should be appreciated that any suitable e-beam inspection tool could alternatively be employed in example embodiments. For example, any e-beam inspection tool that is configured to detect electrical defects of integrated circuitry based on detection of voltage contrast due to surface charge induced gray level variations may be employed in some example embodiments.

The e-beam inspection tool of FIG. 10 may include a cathode (e.g., a ZrO/W cathode) 100 that produces a primary beam 102 that is initially focused via a condenser lens 104. The primary beam 102 may then pass between components of a beam blanker 106 to a stigmator objective aperture 108. A detector 110 may be positioned proximate to the objective aperture 108 to receive deflections of secondary and back scattered electrons 112 that pass through a magnetic lens 114 between deflectors 116 that are arranged in a direction substantially parallel to the direction of travel of the primary beam 102. The e-beam inspection tool may also include an in-lens deflector 118 that lies parallel to the wafer plane 120. Wafers may be sequentially moved (e.g., on a conveyor or other linear movement mechanism) to be placed and aligned for inspection by the e-beam inspection tool. Once aligned with the wafer, the primary beam 102 of the e-beam inspection tool may be steered electronically to scan an entirety or at least a desired portion of the wafer for voltage contrast readings.

In some embodiments, the e-beam inspection tool may operate under the control of a controller or other processing device. The controller may also be configured to analyze the results of scans performed by the e-beam inspection tool with respect to fault detection. As indicated above, the expectation may be that every other CO provides different voltage contrast due to the alternating grounding and floating of the COs. Accordingly, when the controller determines that consecutive COs have the same voltage contrast characteristics, a piping defect may be indicated.

Some example embodiments may therefore provide a fast in-line check for a flash memory array (e.g., a NOR flash array) to determine CO piping defects using an e-beam inspection tool. Embodiments may be extended also to application with embedded pattern bridge, damascene ML1 (W1) CMP or word line/bit line after etch inspection (AEI).

Figure 11:
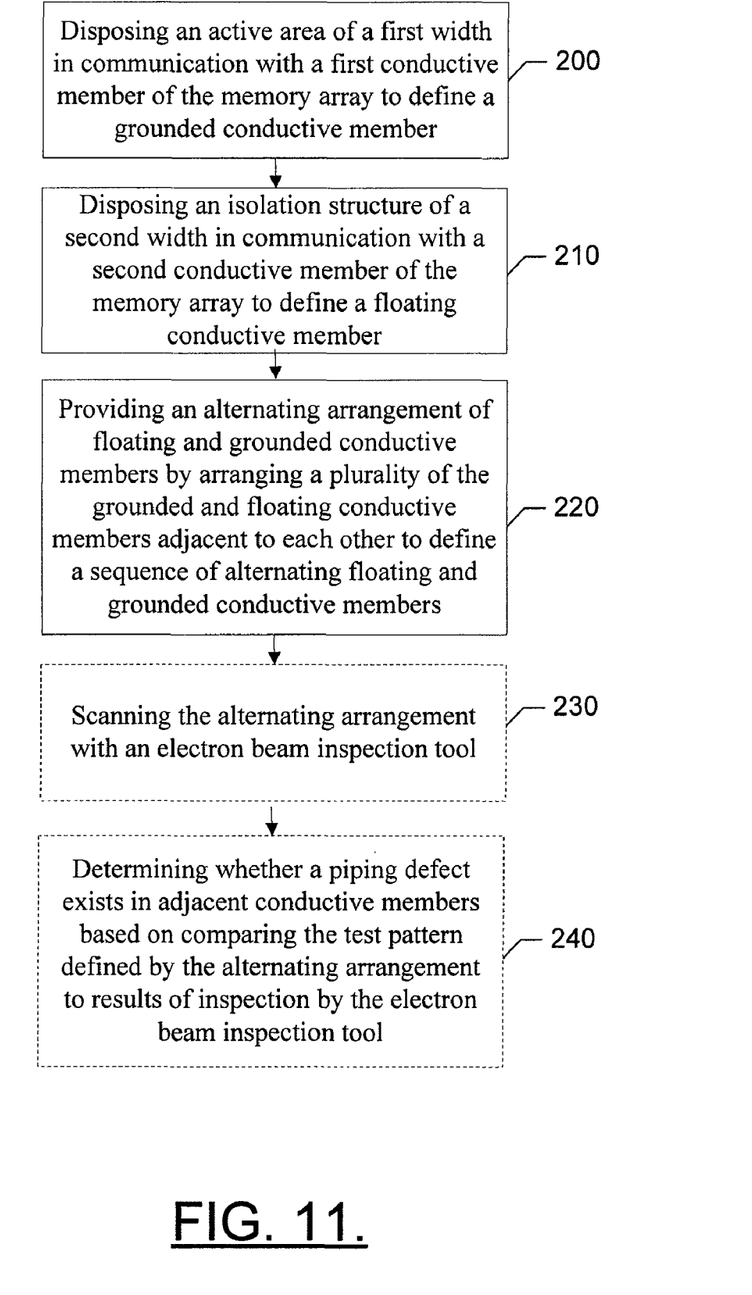
FIG. 11 is a block diagram describing a method for providing a test pattern for detection of manufacturing defects at a memory array according to an example embodiment of the present invention.

FIG. 11 is a flowchart illustrating operations associated with an example method of providing a test pattern for detection of manufacturing defects at a memory array according to an example embodiment. It should be understood that each block of the flowchart, and combinations of blocks in the flowchart, can be implemented by various mechanisms, such as under the control of an operator or via hardware, alone or under direction of firmware and/or software including one or more computer program instructions. For example, one or more of the procedures described herein may be embodied by computer program instructions. In this regard, the computer program instructions which embody the procedures described above may be stored by a memory and executed by a processor. As will be appreciated, any such computer program instructions may be loaded onto a computer or other programmable apparatus (i.e., hardware) to produce a machine, such that the instructions which execute on the computer or other programmable apparatus create means for implementing the functions specified in the flowchart block (s). These computer program instructions may also be stored in a computer-readable electronic storage memory that can direct a computer or other programmable apparatus to function in a particular manner, such that the instructions stored in the computer-readable memory produce an article of manufacture including instruction means which implement the function specified in the flowchart block(s). The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart block(s).

Accordingly, blocks of the flowchart support combinations of means for performing the specified functions, combinations of operations for performing the specified functions and program instruction means for performing the specified functions. It will also be understood that one or more blocks of the flowchart, and combinations of blocks in the flowchart, can be implemented by special purpose hardware-based computer systems which perform the specified functions or operations, or combinations of special purpose hardware and computer instructions.

As shown in FIG. 11, a method for providing a test pattern for detection of manufacturing defects at a memory array according to one example may include disposing an active area of a first width in communication with a first conductive member of the memory array to define a grounded conductive member at operation 200, disposing an isolation structure of a second width in communication with a second conductive member of the memory array to define a floating conductive member at operation 210, and providing an alternating arrangement of floating and grounded conductive members by arranging a plurality of the grounded and floating conductive members adjacent to each other to define a sequence of alternating floating and grounded conductive members at operation 220.

In some embodiments, the operations above may be modified or amplified as described below. Moreover, in some cases, further operations may be conducted in addition to those discussed above, some examples of which are shown in FIG. 11 in dashed lines. Some or all of the modifications, amplifications and/or additional operations may be combined in some embodiments in any order and in every possible combination. For example, in some cases, the method may further include scanning the alternating arrangement with an electron beam inspection tool at operation 230. The method may further include determining whether a piping defect exists in adjacent conductive members based on comparing the test pattern defined by the alternating arrangement to results of inspection by the electron beam inspection tool at operation 240. The test pattern may include alternating different voltage contrast characteristics for each sequential conductive member. More specifically, the test pattern may in some cases include alternating instances of results showing bright voltage contrast returns corresponding to floating conductive members, and results showing bright voltage contrast returns surrounded by dark rings corresponding to grounded conductive members characteristics. In either case, determining whether the piping defect exists may include detecting the piping defect responsive to the results indicating no change in voltage contrast characteristics for a set of consecutive conductive members. In various different example embodiments, the first width and the second width may be equal or different (e.g., the first width being smaller than the second width or vice versa).

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe exemplary embodiments in the context of certain exemplary combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A method for detection of manufacturing defects in a memory array comprising:
    disposing an active area of a first width in communication with a first conductive member of the memory array to define a grounded conductive member;
    disposing an isolation structure of a second width in communication with a second conductive member of the memory array to define a floating conductive member; and
    providing an alternating arrangement of floating and grounded conductive members, including arranging a plurality of the grounded and floating conductive members adjacent to each other to define a sequence of alternating floating and grounded conductive members.

2. The method of claim 1, further comprising scanning the alternating arrangement with an electron beam inspection tool.

3. The method of claim 2, further comprising determining whether a piping defect exists in adjacent conductive members based on comparing the test pattern defined by the alternating arrangement to results of inspection by the electron beam inspection tool, the test pattern comprising alternating different voltage contrast characteristics for each consecutive conductive member.

4. The method of claim 3, wherein determining whether the piping defect exists comprises detecting the piping defect responsive to the results indicating no change in voltage contrast characteristics for a set of sequential conductive members.

5. The method of claim 2, further comprising determining whether a piping defect exists in adjacent conductive members based on comparing the test pattern defined by the alternating arrangement to results of inspection by the electron beam inspection tool, the test pattern comprising alternating instances of results showing bright voltage contrast returns corresponding to floating conductive members and results showing bright voltage contrast returns surrounded by dark rings corresponding to grounded conductive members characteristics.

6. The method of claim 5, wherein determining whether the piping defect exists comprises detecting the piping defect responsive to the results indicating no change in voltage contrast characteristics for a set of consecutive conductive members.

7. The method of claim 1, wherein the first width and the second width are equal.

8. The method of claim 1, wherein the first width and the second width are different.

9. The method of claim 1, wherein the first width is smaller than the second width.

10. A test device for detection of manufacturing defects at a memory array comprising:
    a wafer including the memory array; and
    an electron beam inspection tool configured to inspect the wafer,
    wherein the wafer is structured by:
        an active area of a first width disposed in communication with a first conductive member of the memory array to define a grounded conductive member;
        an isolation structure of a second width disposed in communication with a second conductive member of the memory array to define a floating conductive member; and
        an alternating arrangement of floating and grounded conductive members provided by arranging a plurality of the grounded and floating conductive members adjacent to each other to define a sequence of alternating floating and grounded conductive members.

11. The test device of claim 10, wherein the test device is configured to enable a determination to be made as to whether a piping defect exists in adjacent conductive members based on comparing a test pattern defined by the alternating arrangement to results of inspection by the electron beam inspection tool, the test pattern comprising alternating different voltage contrast characteristics for each sequential conductive member.

12. The test device of claim 11, wherein the test device is configured to enable a determination to be made as to whether the piping defect exists by detecting the piping defect responsive to the results indicating no change in voltage contrast characteristics for a set of consecutive conductive members.

13. The test device of claim 10, wherein the test device is configured to enable a determination to be made as to whether a piping defect exists in adjacent conductive members based on comparing the test pattern defined by the alternating arrangement to results of inspection by the electron beam inspection tool, the test pattern comprising alternating instances of results showing bright voltage contrast returns corresponding to floating conductive members and results showing bright voltage contrast returns surrounded by dark rings corresponding to grounded conductive members characteristics.

14. The test device of claim 13, wherein the test device is configured to enable a determination to be made as to whether the piping defect exists by detecting the piping defect responsive to the results indicating no change in voltage contrast characteristics for a set of consecutive conductive members.

15. The test device of claim 10, wherein the first width and the second width are equal.

16. The test device of claim 10, wherein the first width and the second width are different.

17. The test device of claim 10, wherein the first width is smaller than the second width.

* * * * *